(12) United States Patent
Srinivasan et al.

(10) Patent No.: US 11,513,544 B1
(45) Date of Patent: Nov. 29, 2022

(54) RESET AND SAFE STATE LOGIC GENERATION IN DUAL POWER FLOW DEVICES

(71) Applicant: STMicroelectronics International N.V., Geneva (CH)

(72) Inventors: Venkata Narayanan Srinivasan, Greater Noida (IN); Mayankkumar Hareshbhai Niranjani, Lathi (IN); Dhulipalla Phaneendra Kumar, Noida (IN); Gourav Garg, Kaithal (IN); Sourabh Banzal, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/537,010

(22) Filed: Nov. 29, 2021

(51) Int. Cl.
| | |
|---|---|
| *G05F 1/10* | (2006.01) |
| *G05F 3/02* | (2006.01) |
| *G05F 1/46* | (2006.01) |
| *H03K 19/20* | (2006.01) |

(52) U.S. Cl.
CPC .............. *G05F 1/46* (2013.01); *H03K 19/20* (2013.01)

(58) Field of Classification Search
CPC .... G06F 1/3203; H02J 9/005; H03K 19/0008; H03K 19/0013; H03K 19/0016
USPC .................................................. 327/544–546
See application file for complete search history.

(56) References Cited

U.S. PATENT DOCUMENTS

| | | | | |
|---|---|---|---|---|
| 7,770,037 | B2* | 8/2010 | Searles | ..................... G06F 1/28 |
| | | | | 327/143 |
| 2009/0204835 | A1* | 8/2009 | Smith | ................... G06F 1/3287 |
| | | | | 713/323 |
| 2009/0315399 | A1* | 12/2009 | Shikata | ................. G06F 1/3287 |
| | | | | 307/38 |

* cited by examiner

*Primary Examiner* — Quan Tra
(74) *Attorney, Agent, or Firm* — Slater Matsil, LLP

(57) ABSTRACT

An electric device includes: a first power domain; a second power domain; a third power domain, where during power-up, the third, the second, and the first power domains are configured to be powered up sequentially, where during standby-exit, the first, the second, and the third power domains are configured to be powered up sequentially; isolation paths that provide controlled signal transmission among the first, the second, and the third power domains, where each isolation path includes an isolation circuit between an input power domain and an output power domain of the isolation path; and a control circuit in the first power domain, where for each isolation path, the control circuit is configured to generate an isolation control signal for the isolation circuit, where the isolation circuit is configured enable or disable signal transmission along the isolation path.

20 Claims, 6 Drawing Sheets

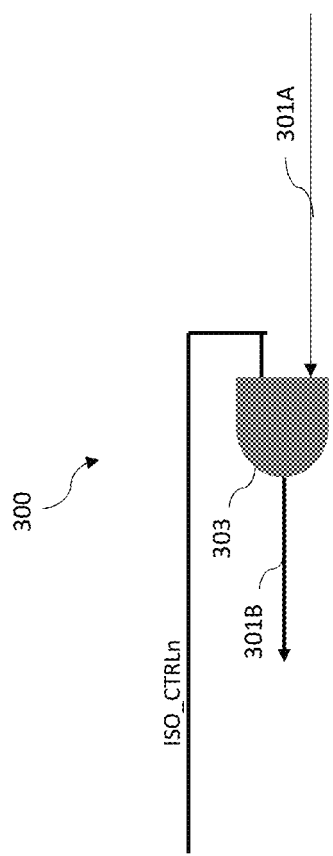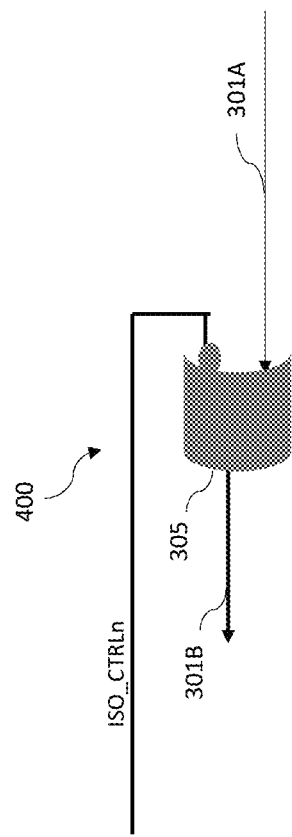
Fig. 3
Fig. 4

RESET AND SAFE STATE LOGIC GENERATION IN DUAL POWER FLOW DEVICES

TECHNICAL FIELD

The present invention relates generally to electronic circuits, and, in particular embodiments, to a circuit for generating reset and isolation control signals in an electric device having multiple power domains.

BACKGROUND

Electric devices, such as computers, mobile phones, and home appliances, may have multiple power domains in order to be energy efficient. For example, an electric device may have a standby power domain, a low-power power domain, and a RUN mode power domain. The standby power domain, which has very low power consumption, may remain always ON after the electric device is turned on, such that the electric device stays in a standby mode and waits for the user's input to get out of the standby mode. The low-power power domain may perform certain functions at a reduced power consumption in a low-power mode. The RUN mode power domain may be used for performing full-power operation in a RUN mode when maximum performance of the electric device is required. The electric device may switch between the different operation modes (e.g. standby mode, low-power mode, and RUN mode) to achieve energy efficiency.

While providing energy efficiency, the multiple power domains pose certain challenges for the design of the electronic device. For example, since not all power domains are powered up at the same time, the signals coming from, or going into, an un-powered power domain may be undetermined. Therefore, isolation paths may have to be implemented between the multiple power domains to provide data paths with isolation functions between the multiple power domains. The isolation path is designed to allow transmission of digital signals when the power domains on both sides of the isolation path are being powered (e.g., powered on), and is designed to disable transmission of digital signals when at least one of the power domains on both sides of the isolation paths is un-powered (e.g., powered off). In addition, digital interfaces may have to be implemented in the multiple power domains to interact with the isolation paths properly in different operational modes.

SUMMARY

In some embodiments, an electric device with dual power flow modes includes: a first power domain; a second power domain; a third power domain, wherein in a first power flow mode during power-up, the third power domain, the second power domain, and the first power domain are configured to be powered up sequentially, wherein in a second power flow mode during exit of a standby mode of the electric device, the first power domain remains powered, the second power domain and the third power domain are configured to be powered up sequentially; isolation paths that provide controlled signal transmission among the first power domain, the second power domain, and the third power domain, wherein each isolation path comprises an isolation circuit coupled between an input power domain of the isolation path and an output power domain of the isolation path, with the input power domain and the output power domain being two of the first, the second, and the third power domains connected by the isolation path; and a reset and safe state logic generation (RSSLG) circuit in the first power domain, wherein for each isolation path, the RSSLG circuit is configured to generate an isolation control signal for the isolation circuit in the isolation path, wherein the isolation circuit is configured to allow signal transmission along the isolation path from the input power domain to the output power domain when the isolation control signal has a first value, and is configured to disable signal transmission along the isolation path when the isolation control signal has a second value.

In some embodiments, an electric device includes: a first power domain, a second power domain, and a third power domain, wherein during a power-up process of the electric device, the third power domain, the second power domain, and the first power domain are powered up sequentially, wherein during a standby-exit process of the electric device, the first power domain, the second power domain, and the third power domain are powered up sequentially; isolation paths between the first and the second power domains, between the second and the third power domains, and between the first and the third power domains, wherein each isolation path of the isolation paths comprises an isolation circuit controlled by an isolation control signal, wherein for each isolation path, when the isolation control signal has a first value, the isolation circuit allows digital signals to pass through the isolation circuit from an input power domain of the isolation path to an output power domain of the isolation path, and when the isolation control signal has a second value, the isolation circuit prevents digital signals from passing through the isolation circuit, wherein the input power domain and the output power domain are two of the first, the second, and the third power domains connected to the isolation path; and a reset and safe state logic generation (RSSLG) circuit in the first power domain, wherein for each isolation path, the RSSLG circuit is configured to generate the isolation control signal with the first value when at least the input power domain and the output power domain of the isolation path are powered on, and is configured to generate the isolation control signal with the second value when the input power domain or the output power domain of the isolation path are powered off.

In some embodiments, an electric device includes: a standby (STBY) power domain, a lower-power (LP) power domain, and a RUN mode (RM) power domain, wherein in a first power flow mode of the electric device, the RM power domain, the LP power domain, and the STBY power domain are powered up sequentially, wherein in a second power flow mode of the electric device, the STBY power domain remains powered while the LP power domain and the RM power domain are powered up sequentially; isolation paths between the STBY and the LP power domains, between the LP and the RM power domains, and between the STBY and the RM power domains, wherein each isolation path comprises an isolation circuit and provides a data path with an isolation function between an input power domain of the isolation path and an output power domain of the isolation path, wherein the input power domain and the output power domain are power domains of the electric device connected to the isolation path, wherein for each isolation path, when an isolation control signal of the isolation circuit has a first value, the isolation circuit allows transmission of digital signals from the input power domain of the isolation path to the output power domain of the isolation path, and when the isolation control signal has a second value, the isolation circuit prevents transmission of digital signals from the input power domain of the isolation path to the output power domain of the isolation path; and a reset and safe state logic generation (RSSLG) circuit in the STBY power domain, wherein for each isolation path, the RSSLG circuit is configured to generate the isolation control signal with the first value when at least the input power domain and the output power domain of the isolation path are powered on, and is configured to generate the isolation control signal with the second value when the input power domain or the output power domain of the isolation path are powered off.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, which will generally not be re-described in the interest of brevity. For a more complete understanding of the invention, reference is now made to the following descriptions taken in conjunction with the accompanying drawings, in which:

FIG. 3 illustrates an isolation circuit of the various isolation paths in FIGS. 2A-2F, in an embodiment;

FIG. 4 illustrates an isolation circuit of the various isolation paths in FIGS. 2A-2F, in another embodiment;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to example embodiments in a specific context, namely a circuit for generating reset and isolation control signals in an electric device having multiple power domains and dual power flow modes.

Figure 1:
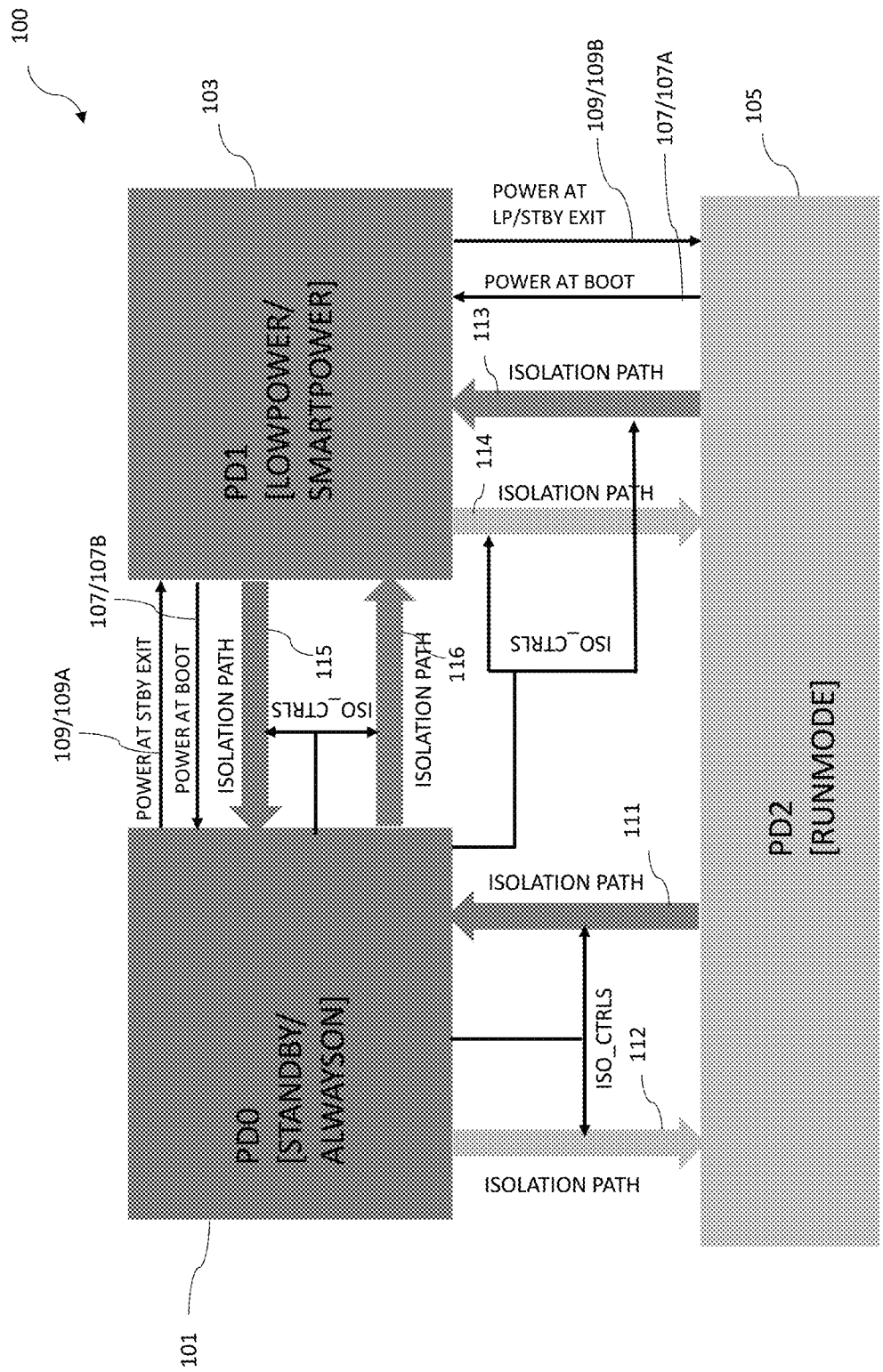
FIG. 1 illustrates a block diagram of an electric device with multiple power domains, in an embodiment.

FIG. 1 illustrates a block diagram of an electric device 100 with multiple power domains, in an embodiment. The electric device 100 may be, e.g., a computer, a mobile phone, a home appliance, or the like. As illustrated in FIG. 1, the electric device 100 includes three power domains, such as a first power domain 101, a second power domain 103, and a third power domain 105. In the illustrated example, the first power domain 101 is a standby power (STBY) domain, and may be referred to as a standby/always-on power domain, or power domain PD0 in the discussion herein. The second power domain 103 is a low-power (LP) power domain, and may be referred to as a low-power/smart-power power domain, or power domain PD1. The third power domain 105 is a RUN mode power domain, and may be referred to as power domain PD2. The first power domain 101, the second power domain 103, and the third power domain 105 may be collectively referred to as the power domains of the electric device 100.

In some embodiments, each of the power domains (e.g., 101, 103, and 105) is powered by one or more power supplies, such as a switched mode power supply (SMPS). Examples of SMPS includes Buck converter, Boost converter, or the like. The power supply of each power domain may be formed in the respective power domain, and the power supplies in all of the power domains (e.g., 101, 103, and 105) may be controlled by a controller of the electric device 100. The power supply for each power domain may include one or more power switches, where the power switch(es) is switched on and off alternately by a respective control signal (e.g., a pulse-width modulated (PWM) control signal) to provide a supply voltage to the power domain. The power domain is said to be powered on, or being powered, when its power supply is turned on (e.g., providing the supply voltage). When the power switch(es) is turned off (e.g., no longer switching between the ON state and the OFF state but stays in the OFF state), the power supply is turned off, and the corresponding power domain is said to be power off, or not being powered.

In some embodiments, each power domain (e.g., 101, 103, 105) includes its respective electrical components and/or circuits that perform certain functions. For example, the standby power domain 101, which has very low power consumption, may be powered on in a standby mode of the electric device 100 while the low-power power domain 103 and the RUN mode power domain 105 are powered off to save energy. In some embodiments, the standby power domain 101 monitors user input during the standby mode, and in response to a detected user input, exits the standby mode into, e.g., a low-power mode or a RUN mode. The low-power power domain 103 may perform certain functions at a reduced power consumption in the low-power mode. In the low-power power mode, the standby power domain 101 and the low-power power domain 103 are powered on, and the RUN mode power domain 105 is powered off. The RUN mode power domain 105 may be used for performing full-power operation in the RUN mode when maximum performance of the electric device 100 is required. The electric device 100 may exit the low-power mode to enter the RUN mode. In the RUN mode, the standby power domain 101, the low-power power domain 103, and the RUN mode power domain 105 are all powered on.

The electric device 100 is a device with dual power flow modes. For example, during power-up of the electric device 100, or during a reset of the electric device 100, the power flow (e.g., the boot-up sequence, or the power-up sequence) in the electric device 100 occurs in a first power flow direction, and when the electric device 100 exits the standby mode and enters the RUN mode, the power flow occurs in a second power flow direction. FIG. 1 illustrates the first power flow path 107 (e.g., 107A, 107B) in the first power flow direction and the second power flow path 109 (e.g., 109A, 109B) in the second power flow direction. In the first power flow direction, the third power domain 105, the second power domain 103, and the first power domain 101 are powered up sequentially during power-up (or reset). After power-up (or reset), when the electric device 100 enters the low power mode, the third power domain 105 is power off. Furthermore, when the electric device 100 enters the standby mode, the second power domain 103 is also power off. When the electric device 100 exits the standby mode to enter the RUN mode, the power flow occurs in the second power flow direction, where only the first power domain 101 is powered up in the beginning (e.g., in the standby mode), then the second power domain 103 is powered up during standby exit, and next, the third power domain 105 is powered up during low power mode exit to enter the RUN mode.

FIG. 1 further illustrates a plurality of isolation paths 111, 112, 113, 114, 115, and 116. Each of the isolation paths electrically couples two power domains (e.g., 101 and 103, 103 and 105, or 101 and 105), and provides a controlled data path between the two power domains. The controlled data path allows transmission of digital signals in the isolation path when an isolation control signal of the isolation path has a first value (e.g., a logic high value) that allows (e.g., enables) the transmission of digital signals. When the isolation control signal has a second value (e.g., a logic low value), the controlled data path prohibits (e.g., disallows, disables, prevents) transmission of digital signals in the isolation path. In the illustrated embodiment, each isolation path is a unidirectional path, which, when enabled by the respective isolation control signal, allows transmission of digital signals from an input power domain of the isolation path to an output power domain of the isolation path. Here, the input power domain refers to the power domain which transmits the digital signals onto the isolation path, and the output power domain refers to the power domain which receives the digital signals from the isolation path. For example, the isolation path 11 provides a controlled data path between the third power domain 105 and the first power domain 101. The arrow of the isolation path 111 shows the direction of data transmission, and therefore, the third power domain 105 is the input power domain of the isolation path 111, and the first power domain 101 is the output power domain of the isolation path 11. Note that each of the isolation paths may be a data bus carrying one or more parallel digital signals, and the isolation control signal for each isolation path enables or disables the transmission of all the digital signals on the data bus, in some embodiments.

Since the power domains 101, 103, and 105 may not be powered on at the same time, a signal transmitted to, or received from, an un-powered power domain may be at an unknown voltage level, and therefore, indeterminable. The isolation paths 111, 112, 113, 114, 115, and 116 ensure signal integrity and proper functioning of the electric device 100 by disabling signal transmission when the input power domain or the output power domain of the isolation path is not powered, and by only allowing signal transmission when at least the input power domain and the output power domain of the isolation path are powered, in some embodiments. In the discussion herein, the isolation paths 111, 112, 113, 114, 115, and 116 may be referred to as the first isolation path 111, the second isolation path 112, the third isolation path 113, the fourth isolation path 114, the fifth isolation path 115, and the sixth isolation path 116, respectively.

FIG. 1 further illustrates the isolation control signals (labeled ISO_CTRLS in FIG. 1) that control the isolation paths. Note that for simplicity, FIG. 1 shows each pair of isolation paths (e.g., 111 and 112, 113 and 114, or 115 and 116) being controlled by an isolation control signal, with the understanding that each isolation path is controlled by its own isolation control signal, as discussed below with reference to FIGS. 2A-2F. Note that in the illustrated embodiment, all of the isolation control signals are generated by the first power domain 101, and no isolation control signal is generated by the second power domain 103 or the third power domain 105.

Figure 2:
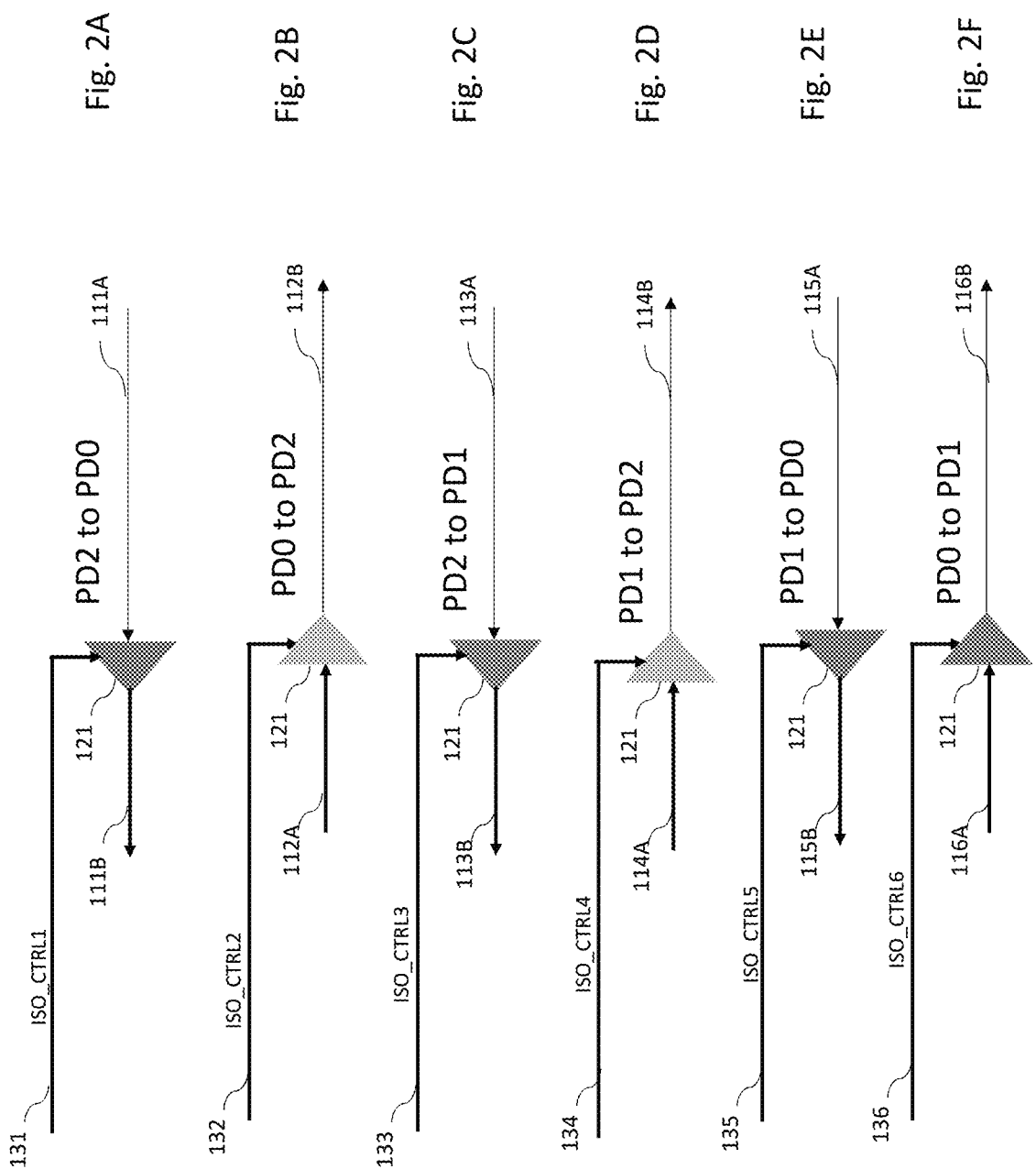
FIGS. 2A-2F illustrate the various isolation paths of the electric device of FIG. 1, in an embodiment.

FIGS. 2A-2F illustrate the various isolation paths of the electric device 100 of FIG. 1, in an embodiment. In particular, FIGS. 2A-2F illustrate the isolation paths 111-116 of FIG. 1, respectively, with each isolation path comprising an input signal path, an output signal path, and an isolation circuit 121 between the input signal path and the output signal path. The isolation circuit 121 in each isolation path is controlled by a respective isolation control signal. For example, FIG. 2A illustrates the isolation path 11 of FIG. 1, which provides a controlled data path from the power domain PD2 to the power domain PD0. The input signal path 111A is coupled to the input power domain (e.g., PD2) to accept a signal from the input power domain. The output signal path 111B is coupled to the output power domain (e.g., PD0). The isolation circuit 121 in FIG. 2A is illustrated as a buffer for illustration purpose and ease of understanding. The isolation circuit 121 may be an AND gate as illustrated in FIG. 3 or an OR gate with an inverted input terminal as illustrated in FIG. 4. The isolation control signal 131 for the isolation circuit 121, labeled as $ISO\_CTRL_1$ in FIG. 2A, is applied at the control terminal of the isolation circuit 121. Depending on the value of the isolation control signal 131, the isolation circuit 121 may pass through the signal at the input signal path 111A to the output signal path 111B, or disconnect the input signal path 111A from the output signal path 111B.

The example of FIG. 2A shows one input signal path (e.g., 111A) and one output signal path (e.g., 111B) in the isolation path 111. One skilled in the art will readily appreciate that the isolation path 111 may include multiple, parallel, signal paths, in which case each of the signal paths may include an isolation circuits 121, and the isolation control signal 131 may be used to control all of the isolation circuits 121 in the isolation path 111. The isolation paths in FIGS. 2B-2F are similar to that in FIG. 2A, thus details are not repeated. In some embodiments, the output signal of each isolation path is saved in a buffer(s) located in the output power domain of the isolation path.

FIG. 3 illustrates an isolation circuit 303 for the various isolation paths in FIGS. 2A-2F, in an embodiment. In the example of FIG. 3, an isolation path 300 is illustrated which includes an input signal path 301A, an output signal path 301B, and the isolation circuit 303. The isolation circuit 303 in the example of FIG. 3 is an AND gate, where a first input terminal of the AND gate 303 is coupled to the isolation control signal (labeled as $ISO\_CTRL_n$), and a second input terminal of the AND gate 303 is coupled to the input signal path 301A. The output terminal of the AND gate 303 is coupled to the output signal path 301B. Skilled artisans will readily appreciate that when the isolation control signal has a logic low value, the AND gate 303 is closed, thereby forcing the output signal of the AND gate 303 to a fixed, known state (e.g., a logic low value), and disabling transmission of signal through the isolation path. When the isolation control signal has a logic high value, the AND gate 303 is open, thereby allowing the signal at the input signal path 301A to pass through to the output signal path 301B. The isolation path 300 in FIG. 3, with the AND gate as the isolation circuit 303 and with the isolation control signal $ISO\_CTRL_n$ (n=1, 2, . . . , or 6), may be used as the n-th isolation path of the isolation paths 111-116 in FIGS. 2A-2F.

FIG. 4 illustrates an isolation circuit 305 of the various isolation paths in FIGS. 2A-2F, in another embodiment. In the example of FIG. 4, an isolation path 400 is illustrated which includes an input signal path 301A, an output signal path 301B, and the isolation circuit 305. The isolation circuit 305 in the example of FIG. 4 is an OR gate with an inverted terminal and a non-inverted terminal, where the inverted input terminal of the OR gate 305 is coupled to the isolation control signal (labeled as ISO_CTRL$_n$), and the non-inverted input terminal of the OR gate 305 is coupled to the input signal path 301A. The output terminal of the OR gate 305 is coupled to the output signal path 301B. Skilled artisans will readily appreciate that when the isolation control signal has a logic low value, the corresponding input to the OR gate 305 (after being inverted by the inverter at the inverted input terminal) is logic high, which forces the output signal of the OR gate 305 to a fixed, known state (e.g., a logic high value), thereby disabling transmission of signal through the isolation path. When the isolation control signal has a logic high value, the OR gate 305 is open, thereby allowing the signal at the input signal path 301A to pass through to the output signal path 301B. The isolation path 400 in FIG. 4, with the OR gate as the isolation circuit 305 and with the isolation control signal ISO_CTRL$_n$ (n=1, 2, . . . , or 6), may be used as the n-th isolation path of the isolation paths 111-116 in FIGS. 2A-2F.

Figure 5:
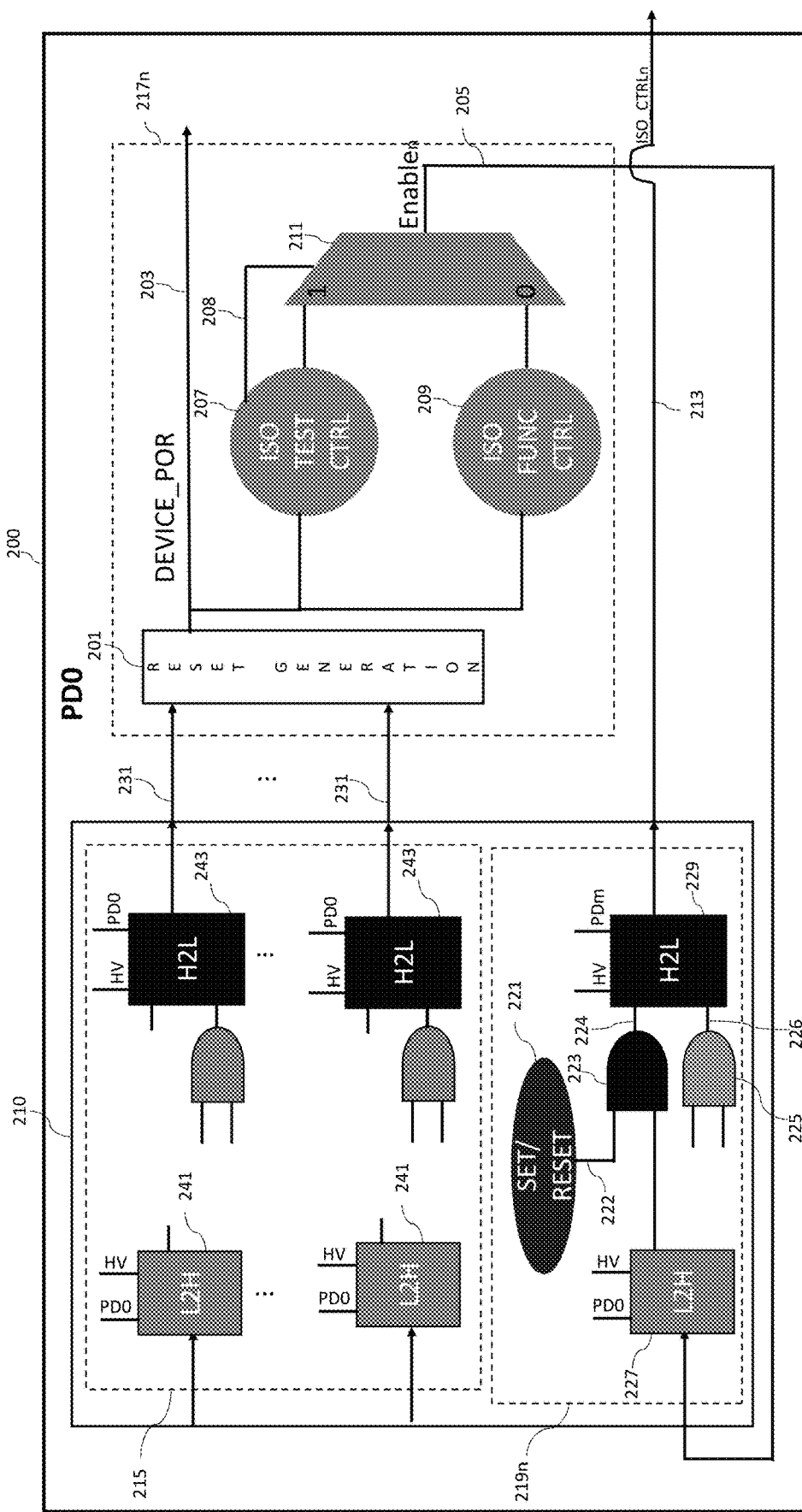
FIG. 5 illustrates a block diagram of a reset and safe state logic generation (RSSLG) circuit of the electric device of FIG. 1, in an embodiment.

FIG. 5 illustrates a block diagram of a reset and safe state logic generation (RSSLG) circuit 200 of the electric device 100 of FIG. 1, in an embodiment. The RSSLG circuit 200 is implemented in the first power domain 101 (e.g., as part of the circuits of the first power domain 101), and is used to generate the isolation control signals (e.g., 131-136 in FIGS. 2A-2F) for the isolation paths 11-116 of FIG. 1. Note that for simplicity, not all features of the RSSLG circuit 200 are illustrated in FIG. 5.

As illustrated in FIG. 5, the RSSLG circuit 200 includes a power management control circuit 210, which in turns includes a circuit 215 and a plurality of circuits 219$_n$, where n=1, 2, . . . , 6. The RSSLG circuit 200 also include a plurality of circuits 217$_n$ coupled to the power management control circuit 210, where n=1, 2, . . . , 6. For simplicity, FIG. 5 only illustrates one of the circuits 219$_n$ and one of the circuits 217$_n$.

In the illustrated embodiment, the circuit 217$_n$ and a corresponding circuit 219$_n$ work together to generate the reset (e.g., power-on-reset) signal for the electric device 100 and/or the isolation control signal (may also be referred to as safe state control signal) for a respective isolation path (e.g., the n-th isolation path). For example, the circuit 217$_1$ and the circuit 219$_1$ work together to generate the isolation control signal for the first isolation path 111, the circuit 217$_2$ and the circuit 219$_2$ work together to generate the isolation control signal for the second isolation path 112, and so on.

In the illustrated embodiment, the first power domain 101 has a low-voltage (LV) power supply (also referred to as PD0 LV supply) for supplying a low supply voltage (e.g., 1V) to the first power domain 101, and has a high-voltage (HV) power supply (also referred to as PD0 HV supply, or HV supply) for supplying a high supply voltage (e.g., 5V) to the first power domain 101. In contrast, the second power domain 103 only has an LV power supply (also referred to as PD1 LV supply), and the third power domain 105 only has an LV power supply (also referred to as PD2 LV supply). In other words, the second power domain 103 and the third power domain 105 do not have the HV power supply. The PD0 LV supply, the PD1 LV supply, and the PD2 LV supply have a same voltage level which is lower than the voltage level of the HV supply of the PD0 power domain, in some embodiments.

In FIG. 5, the circuit 217$_n$ includes a reset generation circuit 201, an isolation test control circuit 207, an isolation function control circuit 209, and a multiplexer (MUX) 211. In some embodiments, during power-up, the PD0 LV supply starts rising from the logic low voltage level (e.g., zero volt). During the time period that the PD0 LV supply is rising but still below the threshold voltage for logic high, the reset generation circuit 201 generates a reset signal 203 (e.g., a power-on reset signal labeled as DEVICE_POR in FIG. 5) that has, e.g., a "0" output (e.g., a logic low value), which reset signal 203 is used to initialize (e.g., reset) the isolation test control circuit 207 and the isolation function control circuit 209. The reset signal 203 may also be used to reset the electric device 100 or portions of the electric device 100.

In the illustrated embodiment, the isolation test control circuit 207 is a test module, such as a design-for-test (DFT) module, and may be controlled through a digital interface (e.g., a JTAG interface) in the PD0 power domain in a test mode of the electric device 100. During normal operation mode (e.g., not in the test mode) of the electric device 100, an output signal 208 of the isolation test control circuit 207 is "0" (e.g., a logic low value), which selects the output of the isolation functional control circuit 209 as the output signal 205 of the MUX 211. The output signal 205 from the circuit 217$_n$ is also referred to as the Enable$_n$ signal for the n-th isolation path.

In some embodiments, the isolation function control circuit 209 is a state machine that controls the entry/exit of the low power mode or the entry/exit of the standby mode. In some embodiments, during power-up, the output signal (e.g., the Enable$_n$ signal) of the isolation function control circuit 209 for the n-th isolation path stays at logic low until the PD0 LV supply, the PD1 LV supply, and the PD2 LV supply rise to the logic high voltage, at which point the Enable$_n$ signal turns into a logic high value. Note that in the illustrated embodiment, after the power-up is completed (e.g., when PD0 LV supply, the HV supply, the PD1 LV supply, and the PD2 LV supply rise above the logic high voltage level), the PD0 power domain stays on (e.g., PD0 LV supply and the HV supply remain powered on) all the time until the electric device 100 is turned off or being reset. After the power-up is completed, the controller of the electric device 100 may instruct the electric device 100 to enter the standby mode or the low-power mode, by powering off the PD1 power domain (e.g., turning off the PD1 LV supply) and/or powering off the PD2 power domain (e.g., turning off the PD2 LV supply).

In some embodiments, after the power-up is completed, the isolation function control circuit 209 is configured to generate a logic low value for the Enable$_n$ signal, when the input power domain of the n-th isolation path or the output power domain of the n-th isolation path is powered off. Note that in the discussion herein, powering off a power domain (e.g., PD0, PD1, PD2) means powering off (e.g., turning off) all of the voltage supplies of that power domain, e.g., powering off the PD0 LV supply and the HV supply in the PD0 power domain, powering off the PD1 LV supply in the PD1 power domain, or powering off the PD2 LV supply in the PD2 power domain. Similarly, powering on a power domain means powering on (e.g., turning on) all of the voltage supplies of that power domain, e.g., powering on the PD0 LV supply and the HV supply in the PD0 power domain, powering on the PD1 LV supply in the PD1 power domain, or powering on the PD2 LV supply in the PD2 power domain.

Figure 6:
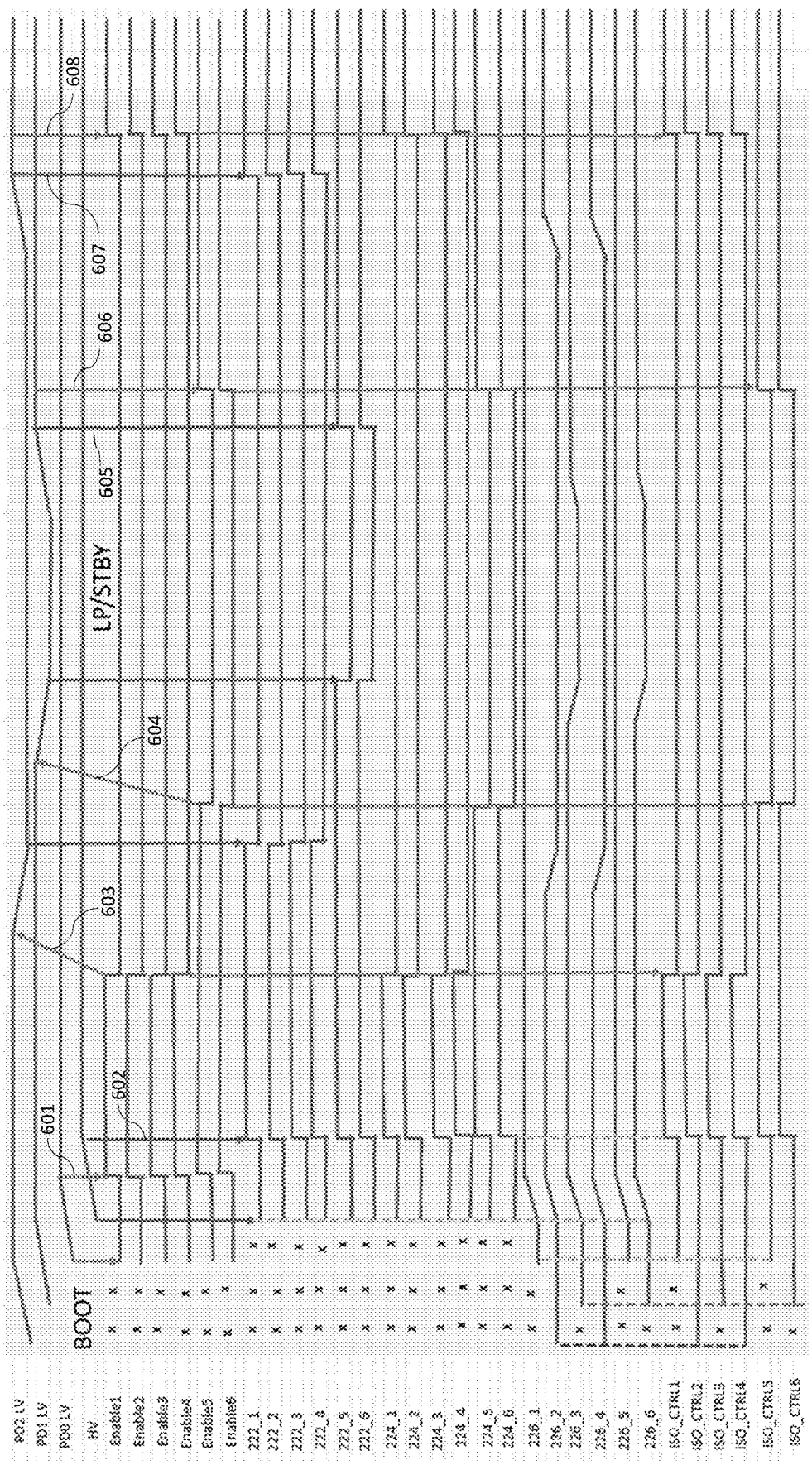
FIG. 6 illustrates a timing diagram of the electric device of FIG. 1, in an embodiment.

In some embodiments, to improve the safety margin for operation of the isolation path, during entry into the low-power mode or the standby mode, before a power domain is powered off (e.g., PD2 power domain being power off for entry into the low-power mode), the isolation function control circuit 209 preemptively disables all of the isolation paths connected to that power domain by generating a logic low value for the respective $Enable_n$ signals sometime (e.g., a pre-determined amount of time) before the supply voltage (e.g., PD2 LV supply) of that power domain starts to decrease (see, e.g., arrowed line 603 in FIG. 6 and the discussion thereof below). Similarly, during exit from the low-power mode or the standby mode, the isolation function control circuit 209 generates a (delayed) logic high value for the $Enable_n$ signal of the n-th isolation path sometime (e.g., a pre-determined amount of time) after all of the supply voltages (e.g., PD2 LV supply and/or PD1 LV supply) in the input power domain and the output power domain of the n-th isolation path are at the logic high value (see arrowed lines 604 and 605 in FIG. 6 and the discussion thereof below).

Still referring to FIG. 5, the $Enable_n$ signal is sent to the circuit $219_n$, where it is level shifted from the PD0 LV supply voltage level to the HV supply voltage level by a low-to-high (L2H) voltage converter 227. The output of the L2H voltage converted 227 (e.g., the leveled shifted $Enable_n$ signal) is gated by an AND gate 223 with an output signal 222 of a SET/RESET circuit 221. The output signal 224 of the AND gate 223 is then level shifted from the HV supply voltage level to the PDm LV supply voltage level by a high-to-low (H2L) voltage converter 229 for the n-th isolation path, where m=0, 1, or 2, and PDm LV supply is the LV supply of the output power domain of the n-th isolation path. The output of the H2L voltage converter 229 (e.g., the level shifted output signal 224) is the isolation control signal 213 (also referred to as the $ISO\_CTRL_n$ signal) for the n-th isolation path. In some embodiments, the $ISO\_CTRL_n$ signal for the n-th isolation path is buffered in the output power domain of the n-th isolation path.

In the illustrated embodiment, the SET/RESET circuit 221 in the circuit $219_n$ is configured to produce an output of "1" (e.g., logic high value) only when the HV supply, the input power domain and the output power domain of the n-th isolation path are powered on; and is configured to produce an output of "0" (e.g., logic low value) if the input power domain or the output power domain of the n-th isolation path is powered off.

In FIG. 5, the H2L voltage converter 229 has an enable terminal, which is coupled to an output signal 226 of an AND gate 225. In the illustrated embodiment, when the signal at the enable terminal is "0" (e.g., logic low), the H2L voltage converter 229 is disabled and the output of the H2L voltage converter 229 is forced to "0." When the signal at the enable terminal is "1" (e.g., logic high), the H2L voltage converter 229 is enabled and the output of the H2L voltage converter 229 (e.g., the $Enable_n$ signal) is the level-shifted output signal 224. In the example of FIG. 5, the AND gate 225 is configured to generate the enable signal for the H2L voltage converter 229 based on the HV supply voltage and the LV supply (e.g., PD0 LV supply, PD1 LV supply, or PD2 LV supply) voltage of the output power domain of the n-th isolation path. The AND gate 225 generates an enable signal of "1" when the HV supply voltage and the LV supply voltage of the output power domain of the n-th isolation path are at the logic high voltage level, in some embodiments.

FIG. 5 further illustrates the circuit 215 in the power management control circuit 210. The circuit 215 includes voltage monitors and other logic circuits (not illustrated). The voltage monitors monitor the supply voltages (e.g., HV supply, PD0 LV supply, PD1 LV supply, and PD2 LV supply) of the power domains PD0, PD1, and PD2. The logic circuits may implement other functions of the RSSLG circuit 200. In the illustrated embodiments, the voltage monitors and the other logic circuits work at the HV supply voltage level, and therefore, the circuit 215 includes a plurality of L2H voltage converters 241 to shift the various signal levels in the RSSLG circuit 200 from the PD0 voltage level to the HV supply voltage level for processing. The output of the voltage monitors and the other logic circuits are then down shifted by the H2L voltage converters 243 to the PD0 LV supply voltage level. At least some of the down shifted signals at the output of the H2L voltage converters 243, such as the voltage monitors' output, are sent out as control signals 231 which are sent to the input terminals of the reset generation circuit 201. The control signals 231 may also be used by the isolation function control circuit 209 and the circuit $217_n$.

FIG. 6 illustrates a timing diagram of the electric device 100 of FIG. 1, in an embodiment. In FIG. 6, the waveforms labeled as PD2 LV, PD1 LV, PD0 LV, and HV illustrate the voltage levels of the PD2 LV supply, the PD1 LV supply, the PD0 LV supply, and the HV supply, respectively. Note that in the example of FIG. 6, the HV supply is powered on after the PD0 LV supply, the PD1 LV supply, and the PD2 LV supply are powered on. Each waveform labeled as $Enable_n$ (n=1, 2, . . . , or 6) shows the Enable signal (e.g., output signal 205 in FIG. 5) for the n-th isolation path. Each waveform labeled as $222\_n$ (n=1, 2, . . . , or 6) shows the output signal 222 in FIG. 5 for the n-th isolation path. Similarly, the waveform labeled as $224\_n$ (n=1, 2, . . . , or 6) shows the output signal 224 in FIG. 5 for the n-th isolation path, the waveform labeled as $226\_n$ (n=1, 2, . . . , or 6) shows the output signal 226 in FIG. 5 for the n-th isolation path, and the waveform labeled as $ISO\_CTRL_n$ (n=1, 2, . . . , or 6) shows the isolation control signal 213 in FIG. 5 for the n-th isolation path.

As illustrated in FIG. 6, at the time indicated by the arrowed line 601, the PD0 LV supply, the PD1 LV supply, and the PD2 LV supply rise to the logic high level, and as a result, the $Enable_n$ (n=1, 2, . . . , 6) signals change from logic low to logic high. At the time indicated by the arrowed line 602, the HV supply rises to the logic high level, the output of the SET/RESET circuits 221 for the isolation paths, labeled as the waveforms $222\_n$ (n=1, 2, . . . , 6) changes from logic low to logic high. The waveforms $226\_n$ (n=1, 2, . . . , 6) are already at logic high at this time, and therefore, the $ISO\_CTRL_n$ (n=1, 2, . . . , 6) signals turn from logic low to logic high, indicating that the power-up (also referred to as boot-up) process is completed.

At the time instant pointed to by the arrow of the arrowed line 603, the PD2 LV supply starts to decrease. This may correspond to an entry into the low-power mode by the electric device 100, where the PD2 LV supply is starting to be powered off. Note that as discussed above, to ensure that all of the isolation paths (e.g., 111, 112, 113, and 114 in FIG. 1) connected to the PD2 power domain are already disabled when the PD2 power domain is power off, the isolation function control circuit 209 preemptively changes the Enable1, Enable2, Enable3, and Enable4 signals to logic low at the time instant corresponding to the tail of the arrowed line 603, thereby forcing the $ISO\_CTRL_1$, $ISO\_CTRL_2$, $ISO\_CTRL_3$, and $ISO\_CTRL_4$ signals to logic low to disable the isolation paths 111, 112, 113, and 114. Note that during the lower-power mode, the PD2 LV supply is power off while the PD0 LV supply and the PV1 LV supply are power on, and therefore, the $Enable_5$ and $Enable_6$ signals are at logic high while the $Enable_1$, $Enable_2$, $Enable_3$, and $Enable_4$ are at logic low.

Still referring to FIG. 6, at the time instant indicated by the arrow of the arrowed line 604, the PD1 LV supply starts to decrease, indicating that the electric device 100 is starting to enter the standby mode where the PD1 LV supply is starting to be powered off. Note that as discussed above, to ensure that all of the isolation paths (e.g., 115 and 116 in FIG. 1) connected between the PD1 and the PD0 power domains are already disabled when the PD1 power domain is power off, the isolation function control circuit 209 preemptively changes the $Enable_5$ and $Enable_6$ signals to logic low at the time instant corresponding to the tail of the arrowed line 604, thereby forcing the $ISO\_CTRL_5$ and $ISO\_CTRL_6$ signals to logic low to disable the isolation paths 115 and 116. At the time instant indicated by the arrowed line 605, the PD1 LV supply rises back to logic high, indicating that the electric device 100 now exits the standby mode and enters the low-power mode. Notice that, as discussed above, the isolation function control circuit 209 delayed the rising of the $Enable_5$ and $Enable_6$ signals for a pre-determined period of time. After the delay, at the time instant indicated by the arrowed line 606, the isolation function control circuit 209 changes the $Enable_5$ and $Enable_6$ signals from low to high, which causes the $ISO\_CTRL_5$ and $ISO\_CTRL_6$ signals to go high, thereby enabling the isolation paths 115 and 116. At the time instant indicated by the arrowed line 607, the PD2 LV supply rises back to logic high, indicating that the electric device 100 now exits the lower-power mode and enters the RUN mode. Notice that, as discussed above, the isolation function control circuit 209 delayed the rising of the $Enable_1$, $Enable_2$, $Enable_3$, and $Enable_4$ signals for a pre-determined period of time. After the delay, at the time instant indicated by the arrowed line 608, the isolation function control circuit 209 changes the $Enable_1$, $Enable_2$, $Enable_3$, and $Enable_4$ signals from low to high, which causes the $ISO\_CTRL_1$, $ISO\_CTRL_2$, $ISO\_CTRL_3$, and $ISO\_CTRL_4$ signals to go high, thereby enabling the isolation paths 111, 112, 113, and 114.

Figure 7:
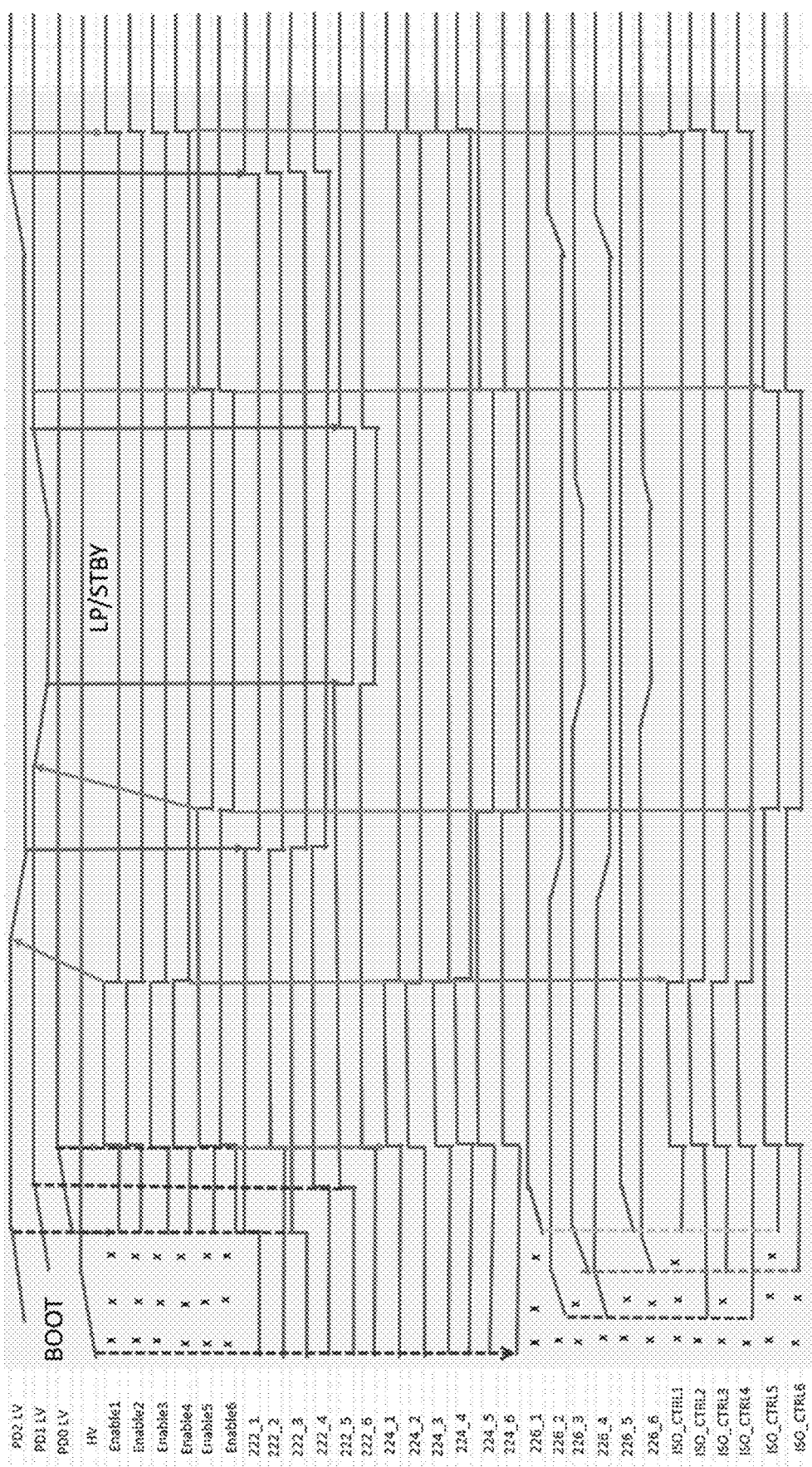
FIG. 7 illustrates a timing diagram of the electric device of FIG. 1, in another embodiment.

FIG. 7 illustrates a timing diagram of the electric device 100 of FIG. 1, in another embodiment. The timing diagram of FIG. 7 is similar to that of FIG. 6, but in FIG. 7, the HV supply is powered on before the PD0 LV supply, the PD1 LV supply, and the PD2 LV supply are powered on. The operation of the RSSLG circuit 200 in FIG. 7 is the same as or similar to that of FIG. 6, thus details are not repeated.

Disclosed embodiments may achieve advantages. For example, in the disclosed embodiment, the RSSLG circuit 200 for generating the isolation control signals for all of the isolation paths are implemented in the PD0 power domain, and no isolation control signal is generated in the PD1 power domain or the PD2 power domain. The present disclosure allows the reset and safe state logic implementation made in the LV supply domain for a single power flow (e.g., along the direction from the PD0 power domain to the PD2 power domain) to be used also in a dual power flow design by splitting implementation in both LV and HV supply domains. Compared with a reset and safe state logic circuit designed for single power flow, the current design only has some minor change in implementation, and as a result, little or no extra overhead for verification is needed. Without the presently disclosed design, the reset and safe state logic circuit for the single power flow may have to be duplicated in all of the power domains of the electric device, which greatly increases the area and the cost of the design, and requires more development time due to the increased effort in verification of the additional modules implemented in all of the power domains.

Example embodiments of the present invention are summarized here. Other embodiments can also be understood from the entirety of the specification and the claims filed herein.

Example 1. In an embodiment, an electric device with dual power flow modes includes: a first power domain; a second power domain; a third power domain, wherein in a first power flow mode during power-up, the third power domain, the second power domain, and the first power domain are configured to be powered up sequentially, wherein in a second power flow mode during exit of a standby mode of the electric device, the first power domain remains powered, the second power domain and the third power domain are configured to be powered up sequentially; isolation paths that provide controlled signal transmission among the first power domain, the second power domain, and the third power domain, wherein each isolation path comprises an isolation circuit coupled between an input power domain of the isolation path and an output power domain of the isolation path, with the input power domain and the output power domain being two of the first, the second, and the third power domains connected by the isolation path; and a reset and safe state logic generation (RSSLG) circuit in the first power domain, wherein for each isolation path, the RSSLG circuit is configured to generate an isolation control signal for the isolation circuit in the isolation path, wherein the isolation circuit is configured to allow signal transmission along the isolation path from the input power domain to the output power domain when the isolation control signal has a first value, and is configured to disable signal transmission along the isolation path when the isolation control signal has a second value.

Example 2. The electric device of Example 1, wherein for each isolation path, the RSSLG circuit is configured to generate the isolation control signal with the second value when the input power domain or the output power domain of the isolation path is powered off.

Example 3. The electric device of Example 2, wherein for each isolation path, the RSSLG circuit is configured to generate the isolation control signal with the first value when at least the input power domain and the output power domain of the isolation path are powered on.

Example 4. The electric device of Example 3, wherein no isolation control signal is generated by the second power domain or the third power domain.

Example 5. The electric device of Example 1, wherein the isolation circuit is an AND gate, wherein a first input terminal of the AND gate is coupled to the isolation control signal, a second input terminal of the AND gate is coupled to the input power domain, and an output terminal of the AND gate is coupled to the output power domain.

Example 6. The electric device of Example 1, wherein the isolation circuit is an OR gate with an inverted input terminal and a non-inverted input terminal, wherein the inverter input terminal is coupled to the isolation control signal, the non-inverted input terminal is coupled to the input power domain, and an output terminal of the OR gate is coupled to the output power domain.

Example 7. The electric device of Example 1, wherein the first power domain has a first low voltage (LV) supply and a high voltage (HV) supply, wherein the second power domain has a second LV supply, and the third power domain has a third LV supply, wherein the first LV supply, the second LV supply, and the third LV supply have a same first voltage level that is lower than a second voltage level of the HV supply.

Example 8. The electric device of Example 7, wherein the second power domain and the third power domain are free of the HV supply.

Example 9. The electric device of Example 7, wherein the RSSLG circuit comprises a first circuit for generating a first isolation control signal for a first isolation path of the isolation paths, the first circuit comprising: an isolation function control circuit configured to generate, at an output of the isolation function control circuit, an enable signal; a low-to-high (L2H) voltage converter coupled to the output of the isolation function control circuit and configured to convert the enable signal from the first voltage level to the second voltage level; a set/reset circuit configured to generate, at an output of the set/reset circuit, a first control signal at the second voltage level; an AND gate, wherein a first input terminal of the AND gate is coupled to an output of the L2H voltage converter, and a second input terminal of the AND gate is coupled to the output of the set/reset circuit; and a high-to-low (H2L) voltage converter coupled to an output terminal of the AND gate, wherein the H2L voltage converter is configured to generate the isolation control signal for the first isolation path by converting an output signal of the AND gate from the second voltage level to the first voltage level.

Example 10. The electric device of Example 9, wherein the isolation function control circuit is configured to: generate a first logic value for the enable signal when the first LV supply, the second LV supply, and the third LV supply are powered on; and generate a second logic value for the enable signal when the input power domain or the output power domain of the first isolation path is power off.

Example 11. The electric device of Example 10, wherein the set/reset circuit is configured to: generate the first logic value for the first control signal when the HV supply of the first power domain, the input power domain and the output power domain of the first isolation path are powered on; and generate the second logic value for the first control signal when the input power domain or the output power domain of the first isolation path is powered off.

Example 12. In an embodiment, an electric device includes: a first power domain, a second power domain, and a third power domain, wherein during a power-up process of the electric device, the third power domain, the second power domain, and the first power domain are powered up sequentially, wherein during a standby-exit process of the electric device, the first power domain, the second power domain, and the third power domain are powered up sequentially; isolation paths between the first and the second power domains, between the second and the third power domains, and between the first and the third power domains, wherein each isolation path of the isolation paths comprises an isolation circuit controlled by an isolation control signal, wherein for each isolation path, when the isolation control signal has a first value, the isolation circuit allows digital signals to pass through the isolation circuit from an input power domain of the isolation path to an output power domain of the isolation path, and when the isolation control signal has a second value, the isolation circuit prevents digital signals from passing through the isolation circuit, wherein the input power domain and the output power domain are two of the first, the second, and the third power domains connected to the isolation path; and a reset and safe state logic generation (RSSLG) circuit in the first power domain, wherein for each isolation path, the RSSLG circuit is configured to generate the isolation control signal with the first value when at least the input power domain and the output power domain of the isolation path are powered on, and is configured to generate the isolation control signal with the second value when the input power domain or the output power domain of the isolation path is powered off.

Example 13. The electric device of Example 12, wherein no isolation control signal is generated by the second power domain or the third power domain.

Example 14. The electric device of Example 12, wherein the isolation circuit comprises an AND gate or an OR gate.

Example 15. The electric device of Example 12, wherein the first power domain is a standby power domain, the second power domain is a lower-power power domain, and the third power domain is a RUN mode power domain.

Example 16. The electric device of Example 15, wherein in a standby mode of the electric device, the first power domain is powered on, the second power domain and the third power domain are powered off, wherein in a lower-power mode of the electric device, the first power domain and the second power domain are powered on, and the third power domain is powered off, and wherein in a RUN mode of the electric device, the first power domain, the second power domain, and the third power domain are powered on.

Example 17. In an embodiment, an electric device includes: a standby (STBY) power domain, a lower-power (LP) power domain, and a RUN mode (RM) power domain, wherein in a first power flow mode of the electric device, the RM power domain, the LP power domain, and the STBY power domain are powered up sequentially, wherein in a second power flow mode of the electric device, the STBY power domain remains powered while the LP power domain and the RM power domain are powered up sequentially; isolation paths between the STBY and the LP power domains, between the LP and the RM power domains, and between the STBY and the RM power domains, wherein each isolation path comprises an isolation circuit and provides a data path with an isolation function between an input power domain of the isolation path and an output power domain of the isolation path, wherein the input power domain and the output power domain are power domains of the electric device connected to the isolation path, wherein for each isolation path, when an isolation control signal of the isolation circuit has a first value, the isolation circuit allows transmission of digital signals from the input power domain of the isolation path to the output power domain of the isolation path, and when the isolation control signal has a second value, the isolation circuit prevents transmission of digital signals from the input power domain of the isolation path to the output power domain of the isolation path; and a reset and safe state logic generation (RSSLG) circuit in the STBY power domain, wherein for each isolation path, the RSSLG circuit is configured to generate the isolation control signal with the first value when at least the input power domain and the output power domain of the isolation path are powered on, and is configured to generate the isolation control signal with the second value when the input power domain or the output power domain of the isolation path is powered off.

Example 18. The electric device of Example 17, wherein no isolation control signal is generated by the LP power domain or the RM power domain.

Example 19. The electric device of Example 18, wherein the STBY power domain has a first low voltage (LV) supply and a high voltage (HV) supply, wherein the LP power domain has a second LV supply, and the RM power domain has a third LV supply, wherein the first LV supply, the second LV supply, and the third LV supply have a same voltage level that is lower than a voltage level of the HV supply.

Example 20. The electric device of Example 19, wherein the LP power domain and the RM power domain are free of the HV supply.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electric device with dual power flow modes, the electric device comprising:
   a first power domain;
   a second power domain;
   a third power domain, wherein in a first power flow mode during power-up, the third power domain, the second power domain, and the first power domain are configured to be powered up sequentially, wherein in a second power flow mode during exit of a standby mode of the electric device, the first power domain remains powered, the second power domain and the third power domain are configured to be powered up sequentially;
   isolation paths that provide controlled signal transmission among the first power domain, the second power domain, and the third power domain, wherein each isolation path comprises an isolation circuit coupled between an input power domain of the isolation path and an output power domain of the isolation path, with the input power domain and the output power domain being two of the first, the second, and the third power domains connected by the isolation path; and
   a reset and safe state logic generation (RSSLG) circuit in the first power domain, wherein for each isolation path, the RSSLG circuit is configured to generate an isolation control signal for the isolation circuit in the isolation path, wherein the isolation circuit is configured to allow signal transmission along the isolation path from the input power domain to the output power domain when the isolation control signal has a first value, and is configured to disable signal transmission along the isolation path when the isolation control signal has a second value.

2. The electric device of claim 1, wherein for each isolation path, the RSSLG circuit is configured to generate the isolation control signal with the second value when the input power domain or the output power domain of the isolation path is powered off.

3. The electric device of claim 2, wherein for each isolation path, the RSSLG circuit is configured to generate the isolation control signal with the first value when at least the input power domain and the output power domain of the isolation path are powered on.

4. The electric device of claim 3, wherein no isolation control signal is generated by the second power domain or the third power domain.

5. The electric device of claim 1, wherein the isolation circuit is an AND gate, wherein a first input terminal of the AND gate is coupled to the isolation control signal, a second input terminal of the AND gate is coupled to the input power domain, and an output terminal of the AND gate is coupled to the output power domain.

6. The electric device of claim 1, wherein the isolation circuit is an OR gate with an inverted input terminal and a non-inverted input terminal, wherein the inverter input terminal is coupled to the isolation control signal, the non-inverted input terminal is coupled to the input power domain, and an output terminal of the OR gate is coupled to the output power domain.

7. The electric device of claim 1, wherein the first power domain has a first low voltage (LV) supply and a high voltage (HV) supply, wherein the second power domain has a second LV supply, and the third power domain has a third LV supply, wherein the first LV supply, the second LV supply, and the third LV supply have a same first voltage level that is lower than a second voltage level of the HV supply.

8. The electric device of claim 7, wherein the second power domain and the third power domain are free of the HV supply.

9. The electric device of claim 7, wherein the RSSLG circuit comprises a first circuit for generating a first isolation control signal for a first isolation path of the isolation paths, the first circuit comprising:
   an isolation function control circuit configured to generate, at an output of the isolation function control circuit, an enable signal;
   a low-to-high (L2H) voltage converter coupled to the output of the isolation function control circuit and configured to convert the enable signal from the first voltage level to the second voltage level;
   a set/reset circuit configured to generate, at an output of the set/reset circuit, a first control signal at the second voltage level;
   an AND gate, wherein a first input terminal of the AND gate is coupled to an output of the L2H voltage converter, and a second input terminal of the AND gate is coupled to the output of the set/reset circuit; and
   a high-to-low (H2L) voltage converter coupled to an output terminal of the AND gate, wherein the H2L voltage converter is configured to generate the isolation control signal for the first isolation path by converting an output signal of the AND gate from the second voltage level to the first voltage level.

10. The electric device of claim 9, wherein the isolation function control circuit is configured to:
   generate a first logic value for the enable signal when the first LV supply, the second LV supply, and the third LV supply are powered on; and
   generate a second logic value for the enable signal when the input power domain or the output power domain of the first isolation path is power off.

11. The electric device of claim 10, wherein the set/reset circuit is configured to:
   generate the first logic value for the first control signal when the HV supply of the first power domain, the input power domain and the output power domain of the first isolation path are powered on; and
   generate the second logic value for the first control signal when the input power domain or the output power domain of the first isolation path is powered off.

12. An electric device comprising:
   a first power domain, a second power domain, and a third power domain, wherein during a power-up process of the electric device, the third power domain, the second power domain, and the first power domain are powered up sequentially, wherein during a standby-exit process of the electric device, the first power domain, the second power domain, and the third power domain are powered up sequentially;
   isolation paths between the first and the second power domains, between the second and the third power domains, and between the first and the third power domains, wherein each isolation path of the isolation paths comprises an isolation circuit controlled by an isolation control signal, wherein for each isolation path, when the isolation control signal has a first value, the isolation circuit allows digital signals to pass through the isolation circuit from an input power domain of the isolation path to an output power domain of the isolation path, and when the isolation control signal has a second value, the isolation circuit prevents digital signals from passing through the isolation circuit, wherein the input power domain and the output power domain are two of the first, the second, and the third power domains connected to the isolation path; and a reset and safe state logic generation (RSSLG) circuit in the first power domain, wherein for each isolation path, the RSSLG circuit is configured to generate the isolation control signal with the first value when at least the input power domain and the output power domain of the isolation path are powered on, and is configured to generate the isolation control signal with the second value when the input power domain or the output power domain of the isolation path is powered off.

13. The electric device of claim 12, wherein no isolation control signal is generated by the second power domain or the third power domain.

14. The electric device of claim 12, wherein the isolation circuit comprises an AND gate or an OR gate.

15. The electric device of claim 12, wherein the first power domain is a standby power domain, the second power domain is a lower-power power domain, and the third power domain is a RUN mode power domain.

16. The electric device of claim 15, wherein in a standby mode of the electric device, the first power domain is powered on, the second power domain and the third power domain are powered off, wherein in a lower-power mode of the electric device, the first power domain and the second power domain are powered on, and the third power domain is powered off, and wherein in a RUN mode of the electric device, the first power domain, the second power domain, and the third power domain are powered on.

17. An electric device comprising:

a standby (STBY) power domain, a lower-power (LP) power domain, and a RUN mode (RM) power domain, wherein in a first power flow mode of the electric device, the RM power domain, the LP power domain, and the STBY power domain are powered up sequentially, wherein in a second power flow mode of the electric device, the STBY power domain remains powered while the LP power domain and the RM power domain are powered up sequentially;

isolation paths between the STBY and the LP power domains, between the LP and the RM power domains, and between the STBY and the RM power domains, wherein each isolation path comprises an isolation circuit and provides a data path with an isolation function between an input power domain of the isolation path and an output power domain of the isolation path, wherein the input power domain and the output power domain are power domains of the electric device connected to the isolation path, wherein for each isolation path, when an isolation control signal of the isolation circuit has a first value, the isolation circuit allows transmission of digital signals from the input power domain of the isolation path to the output power domain of the isolation path, and when the isolation control signal has a second value, the isolation circuit prevents transmission of digital signals from the input power domain of the isolation path to the output power domain of the isolation path; and a reset and safe state logic generation (RSSLG) circuit in the STBY power domain, wherein for each isolation path, the RSSLG circuit is configured to generate the isolation control signal with the first value when at least the input power domain and the output power domain of the isolation path are powered on, and is configured to generate the isolation control signal with the second value when the input power domain or the output power domain of the isolation path is powered off.

18. The electric device of claim 17, wherein no isolation control signal is generated by the LP power domain or the RM power domain.

19. The electric device of claim 18, wherein the STBY power domain has a first low voltage (LV) supply and a high voltage (HV) supply, wherein the LP power domain has a second LV supply, and the RM power domain has a third LV supply, wherein the first LV supply, the second LV supply, and the third LV supply have a same voltage level that is lower than a voltage level of the HV supply.

20. The electric device of claim 19, wherein the LP power domain and the RM power domain are free of the HV supply.

* * * * *